United States Patent [19]

Sasaki

[11] 4,109,141

[45] Aug. 22, 1978

[54] COUNTER OUTPUT DETECTOR CIRCUIT

[75] Inventor: Minoru Sasaki, Tokyo, Japan

[73] Assignee: Tokyo Shibaura Electric Co., Ltd., Kawasaki, Japan

[21] Appl. No.: 830,148

[22] Filed: Sep. 2, 1977

[30] Foreign Application Priority Data

Sep. 9, 1976 [JP] Japan .................................. 51-107266

[51] Int. Cl.² ............................................ H03K 21/10
[52] U.S. Cl. .......................... 235/92 CA; 235/92 EA; 235/92 R; 340/146.2
[58] Field of Search ....... 235/92 EA, 92 CA, 92 LG, 235/92 CC; 340/146.2

[56] References Cited

U.S. PATENT DOCUMENTS

| 3,517,175 | 6/1970 | Williams ............................ 340/146.2 |
| 4,017,830 | 4/1977 | Shigemori et al. ............. 235/92 CA |
| 4,031,511 | 6/1977 | Britton .............................. 340/146.2 |

Primary Examiner—Joseph M. Thesz
Attorney, Agent, or Firm—Oblon, Fisher, Spivak, McClelland & Maier

[57] ABSTRACT

A counter and a memory device are included each of which includes $n$ binary memory units. A coincident signal is outputted when the output data are coincident between the counter and the memory device. Each binary memory unit produces a binary output signal ("1" or "0") and its negated binary output signal ("$\bar{1}$" or "$\bar{0}$". An exclusive OR circuit connected between the first stage memory units of the counter and the memory device. Between the corresponding memory units of the remaining each stage, and AND-OR circuit is provided being connected between a first and a second terminals. The AND-OR circuit is opened when the contents of two corresponding binary memory units are coincident. A first MOS transistor is connected between a common connection line of the first terminal and a power source. A second MOS transistor is connected between a common connection line of the second terminal and the ground. A coincident signal from the exclusive OR circuit makes the first MOS transistor conductive. The signal carried on the common connection line of the first terminal and the output signal of the exclusive OR circuit are applied to a NAND circuit. When the memory contents between the first stages are coincident and the AND-OR circuits are all opened, i.e. the contents of the counter and memory device are entirely coincident, the NAND circuit produces a coincident signal to indicate the coincidence between the output data of the counter and the memory device.

4 Claims, 5 Drawing Figures

COUNTER OUTPUT DETECTOR CIRCUIT

BACKGROUND OF THE INVENTION

The present invention relates to a device for detecting output data of a counter and more particularly to the one in which data to be detected previously stored in a separate memory and the data stored therein is compared with output data of the counter for the detection of the counter output.

One of the prior art counter output detectors is shown in FIG. 1. A first counter of which the output data are detected and the reference numeral attached thereto is 1, counts input pulses $CP_1$ applied thereto. The counter 1 includes first binary memory units 1a to 1d outputting binary output signals $Q_{11}$ to $Q_{14}$ ("1" or "0"). A second counter designated by reference numeral 2 in which reference data are stored includes second binary memory units 2a to 2d outputting binary output signals $Q_{21}$ to $Q_{24}$. The second counter 2 stores a given reference data when the input pulses $CP_2$ are counted by a predetermined number. Each exclusive OR circuit (EXOR) 3, 4, 5 and 6 receives a pair of signals $(Q_{11}, Q_{21})$, $(Q_{12}, Q_{22})$, $(Q_{13}, Q_{23})$, and $(Q_{14}, Q_{24})$, respectively, and the outputs of these EXOR circuits are applied to an OR circuit 7. When data stored in the first and second counters are coincident to each other, the OR circuit 7 outputs a coincident signal Exo. In such a circuit arrangement including EXOR circuits 3 to 6 and OR circuit 7, a number of gate elements are necessarily used so that a signal delay is great, and therefore such the circuit arrangement becomes impracticable as the frequency of the $CP_1$ becomes large. Particularly, this disadvantage becomes distinctive when the number of the first and second binary memory units increases.

Accordingly, an object of the present invention is to provide a device for detecting the output data of a counter with the minimum number of gate elements constituting the data detector and with the minimum signal delay.

SUMMARY OF THE INVENTION

A counter output detector circuit of the present invention includes a counter for counting input pulses and including first binary memory units which are connected in series and produce binary output signals ("1" or "0") and their negated binary output signals ("$\overline{1}$" or "$\overline{0}$"), respectively, and a memory device for storing reference data therein to be compared with the output data from the counter and which includes second binary memory units of the same number as of the first ones, producing binary output signals ("1" or "0") and their negated binary output signals ("$\overline{1}$" or "$\overline{0}$"), respectively. Further included are a plurality of switching circuits which receive as control input signals the binary output signals and their negated binary output signals from the pairs of corresponding first and second memory units of the counter and the memory device except the pair of corresponding first and second memory units at the first stage thereof, and open the paths between first and second terminals, an exclusive OR circuit receiving at the input at least one output signal of the first stage binary memory unit of the counter and at least one output signal of the first stage binary memory unit of the memory device and producing a coincident signal when the contents coincide between the first stage memory units, a first switching transistor which is connected between a common connection line of the first terminals and a power source and is made nonconductive when receiving the coincident signal from the exclusive OR circuit, and a second switching transistor which is connected between a common connection line of the second terminals and the ground, and is made conductive when receiving the coincident signal of the exclusive OR circuit. Still further included is a gate circuit receiving at the input a signal carried on the common connection line of the first terminal and the output signal of the exclusive OR circuit and providing a coincident output signal when the data outputs are coincident between the counter and the memory device.

According to the present invention, a number of gate elements constituting the comparing circuit for comparing the output data of the counter with the reference output data of the memory device is lessened, compared to the conventional one. The signal transfer delay also may be shortened. The frequency of the input pulse to the counter may be increased.

Other objects and features of the present invention will be apparent from the following description in connection with the accompanying drawings, in which:

DETAILED DESCRIPTION OF THE PREFERRED EMBODIMENT

Figure 1:
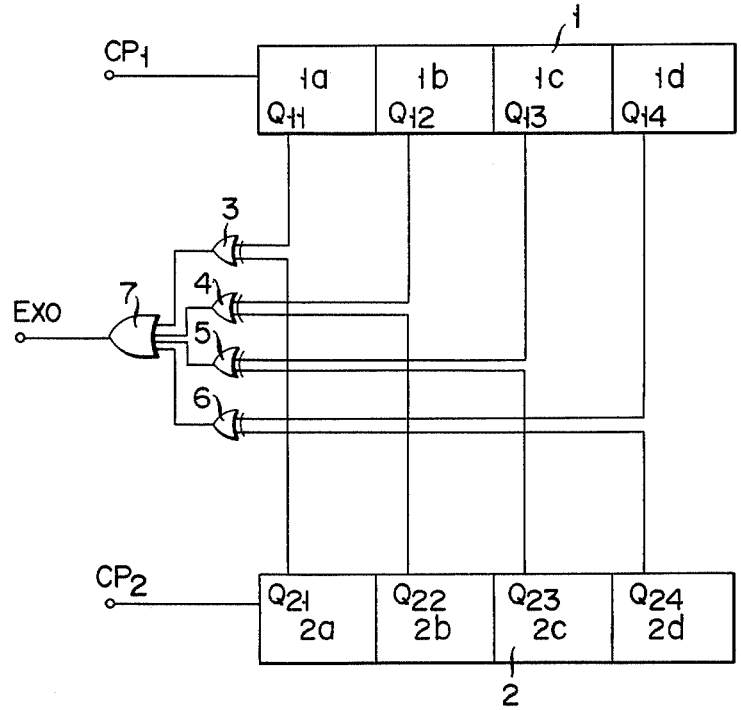
FIG. 1 shows a block diagram of a counter output data detector of prior art.
Figure 2:
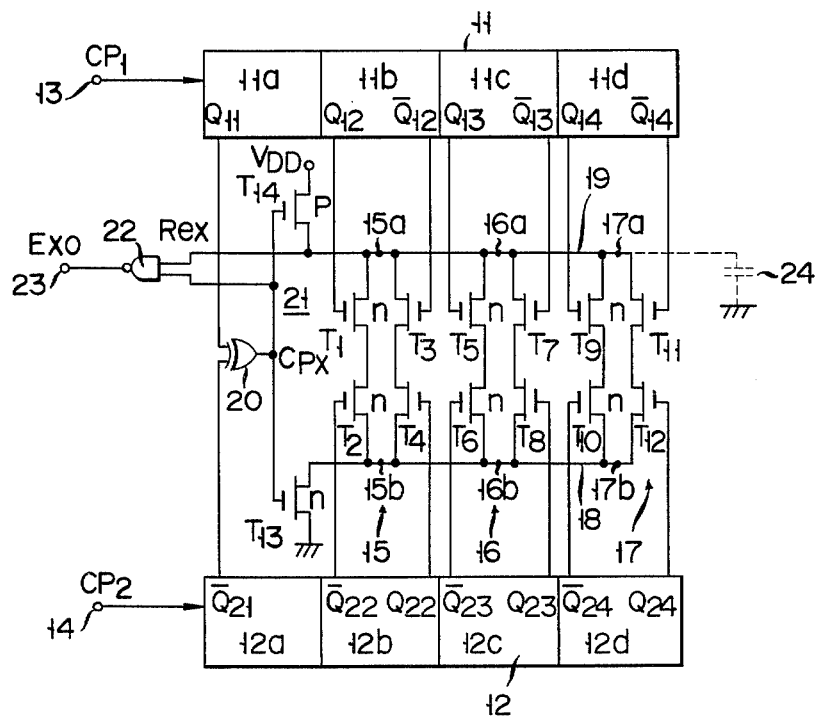
FIG. 2 shows a block diagram of an embodiment of a counter output data detector according to the present invention.

Referring now to FIG. 2, there is shown an embodiment of a counter output data detector according to the present invention. In the figure, a counter 11 of which the output data are to be detected includes four first binary memory units 11a to 11d, for example, counts clock pulses fed from an input terminal 13, for example, clock pulses $CP_1$ of 10 MHz, and is capable of storing 4 bits-data. $Q_{11}$ to $Q_{14}$ represent the binary output signal "1" or "0" and $\overline{Q}_{12}$ to $\overline{Q}_{14}$ the negated binary output signal "$\overline{1}$" or "$\overline{0}$". The binary signal $Q_{11}$ is derived from the memory unit 11a; $Q_{12}$ and $\overline{Q}_{12}$ from the memory unit 11b; $Q_{13}$ and $\overline{Q}_{13}$ from the memory unit 11c; $Q_{14}$ and $\overline{Q}_{14}$ from the memory unit 11d.

A memory device 12 for storing a reference data is comprised of four second binary memory units 12a to 12d and clock pulses $CP_2$ fed from an input terminal 14 and having much lower frequency than the clock pulse $CP_1$ are used to load the reference data therein. The binary output signal "1" or "0" is represented by $Q_{22}$ to $Q_{24}$ and the negated binary output signal by $\overline{Q}_{21}$ to $\overline{Q}_{24}$. The binary signal $\overline{Q}_{21}$ is outputted from the memory unit 12a; $\overline{Q}_{22}$ and $Q_{22}$ from the memory unit 12b; $\overline{Q}_{23}$ and $Q_{23}$ from the memory unit 12c; $\overline{Q}_{24}$ and $Q_{24}$ from the memory unit 12d. A register, for example, as well as the counter may be used for the memory device 12.

An exclusive OR circuit 20 is provided receiving at the input the binary signal $Q_{11}$ from the first stage unit 11a of the counter 11 and the binary signal $\overline{Q}_{21}$ from the first stage memory unit 12a of the memory device 12. AND-OR circuits 15 to 17 are coupled with couples of succeeding stage memory units 11b and 12b, 11c and 12c, and 11d and 12d, respectively. These AND-OR circuits are connected between couples of first and second connection points 15a and 15b, 16a and 16b, and 17a and 17b, respectively. The first AND-OR circuit 15 is comprised of a first AND gate circuit including a first MOS transistor $T_1$ controlled by the output signal $Q_{12}$ and a second MOS transistor $T_2$ controlled by the output signal $\overline{Q}_{22}$, these two transistors being connected in series between the first and second connection points 15a and 15b, and a second AND gate circuit including a third MOS transistor $T_3$ controlled by the output signal $\overline{Q}_{12}$ and a fourth MOS transistor $T_4$ controlled by the output signal $Q_{22}$, these transistors being connected between the first and second connection points 15a and 15b. The transistors $T_1$ to $T_4$ are all of the same conductivity type and, in this example, n-channel MOS transistors are employed. The construction of the AND-OR circuits 16 and 17 are the same as of the AND-OR circuit 15, thus omitting the description thereof.

An n-channel MOS transistor $T_{13}$ is connected between the ground and a common line 18 connecting connection points 15b, 16b and 17b. A p-channel MOS transistor $T_{14}$ is connected between a power source $V_{DD}$ and a common line 19 connecting the connection points 15a, 16a and 17a. A NAND gate circuit 22 is provided receiving at the input the output signal $CP_x$ of the EXOR circuit 20 and the signal R$ex$ carried on the common line 19 and outputting the output signal E$xo$ at the output terminal 23. The stray capacitance designated by 24 represents collectively the stray capacitance of the common line 19 of the gate capacitance of the MOS transistors (not shown) constructing the NAND circuit 22.

Figure 3A:
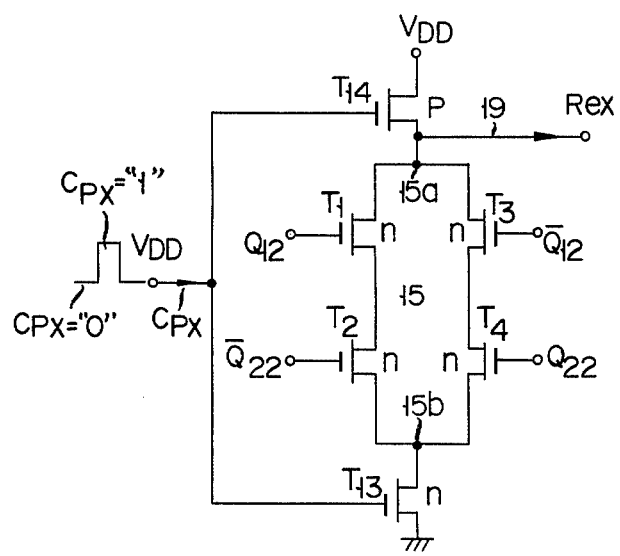
FIGS. 3A and 3B illustrate the operation of an AND-OR circuit shown in FIG. 2, respectively.
Figure 3B:
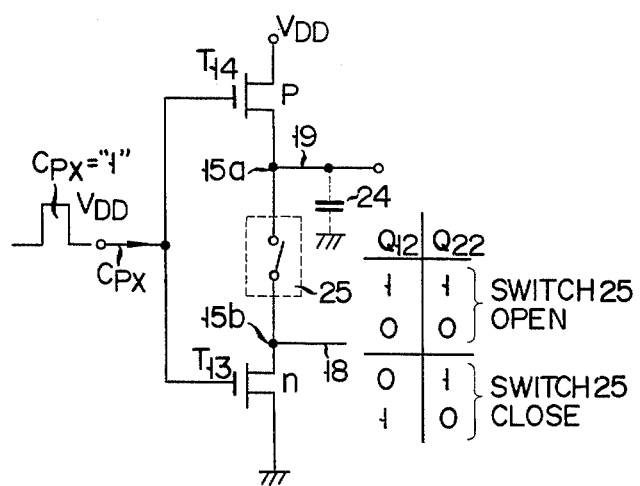

The description to follow is the operation of the AND-OR circuit 15 of FIG. 2, with reference to FIGS. 3A to 3B. Other AND-OR circuits 16 and 17 operate in the same manner as of the circuit 15 and therefore the description thereof will be omitted. When the binary signals $Q_{12}$ and $Q_{22}$ are both "1", i.e. when the contents of the memory units 11b and 12b coincide to each other, $\overline{Q}_{12}$ and $\overline{Q}_{22}$ are both "0". Therefore, the transistors $T_1$ and $T_4$ are conductive while the transistors $T_2$ and $T_3$ are not conductive. If the AND-OR circuit 15 is replaced by a switch 25, the switch 25 opens the path between the connection points 15a and 15b. When $Q_{12}$ and $Q_{22}$ are both "0", i.e. when the contents of the memory units 11b and 12b are coincident, $\overline{Q}_{12}$ and $\overline{Q}_{22}$ are both "1". Therefore, the transistors $T_2$ and $T_3$ are conductive while the transistors $T_1$ and $T_4$ are not conductive. Therefore, the switch 25 is opened. When $Q_{12}$ is "0" and $Q_{22}$ is "1", i.e. the contents 11b and 12b are not coincident, $\overline{Q}_{12}$ and $\overline{Q}_{22}$ are "1" and "0", respectively. This condition renders the transistors $T_3$ and $T_4$ conductive, while the transistors $T_1$ and $T_2$ nonconductive. This leads to the close of the switch 25. In case $Q_{12} = $ "1" and $Q_{22} = $ "0", i.e. the memory contents of the units 11b and 12b are noncoincident, $\overline{Q}_{12}$ is "0" and $\overline{Q}_{22}$ is "1". In this case, the transistors $T_1$ and $T_2$ are both conductive while the transistors $T_3$ and $T_4$ are both nonconductive. This represents the close of the switch 25. In short, when the memory contents of the memory units 11b and 12b are coincident, the switch 25 opens, while these are noncoincident, the switch closes.

In the EXOR circuit 20, when $Q_{11} = $ "1" and $\overline{Q}_{21} = $ "0" or $Q_{11} = $ "0" and $\overline{Q}_{21} = $ "1", i.e. the contents of the memory units 11a and 12a are coincident, the output $C_{Px}$ of the EXOR circuit 20 is "1". On the other hand, when $Q_{11} = $ "1" and $Q_{21} = $ "1" or $Q_{11} = $ "0" and $\overline{Q}_{21} = $ "0", i.e. the memory units 11a and 12a are noncoincident in the contents, the output $C_{Px} = $ "0".

When the output $C_{Px}$ is "0", or the contents of the memory units 11a and 12a do not coincide, the transistor $T_{14}$ conducts so that the stray capacitor 24 is charged by the power source $V_{DD}$ through the transistor $T_{14}$. In contradiction to the transistor $T_{14}$, at this time, the transistor $T_{13}$ does not conduct. When the output $C_{Px}$ is "1", i.e. the contents of the memory units 11a and 12a are coincident, the transistor $T_{14}$ is nonconductive while the transistor $T_{13}$ is conductive.

In order to detect the coincidence between the output data of the memory device 12 and the counter 11, it will seen that it is to detect the coincidents of the contents between the corresponding memory units at all the stages of the counter 11 and the memory device 12. That is, one of the ways to detect the coincidence is to successively compare the contents between the corresponding memory units of the successive stages in the order of 11a and 12a, 11b and 12b, 11c and 12c and 11d and 12d, for example, and to detect the coincidence over all the stages. As described above, when the memory contents 11a and 12a are coincident, the output $C_{Px}$ is "1" and the transistor $T_{13}$ is conductive. The AND-OR circuits 15, 16 and 17 open when the memory contents between the corresponding memory units are coincident and close when they are noncoincident. Therefore, during the period that the contents between the units 11a and 12a are coincident, if at least one of the AND-OR circuits 15, 16 and 17 is closed, the common line 19 is grounded through the closed AND-OR circuit and the transistor $T_{13}$; the signal carried on the line 19 becomes "0" level and the output E$xo$ becomes "1" since the $C_{Px}$ is "1" at this time. This indicates noncoincidence between the output data of the counter 11 and the memory device 12. On the other hand, during the period that the contents between the units 11a and 12a coincide to each other, and the output $C_{Px}$ is "1", if all the AND-OR circuits 16, 17 and 18 are opened, the common line 19 is not grounded and therefore the charged voltage across the stray capacitor 24 is supplied as R$ex$=1 to the NAND circuit 22. Accordingly, the output E$xo$ becomes "0" to indicate that the output data between the counter 11 and the memory device 12 are coincident.

Figure 4:
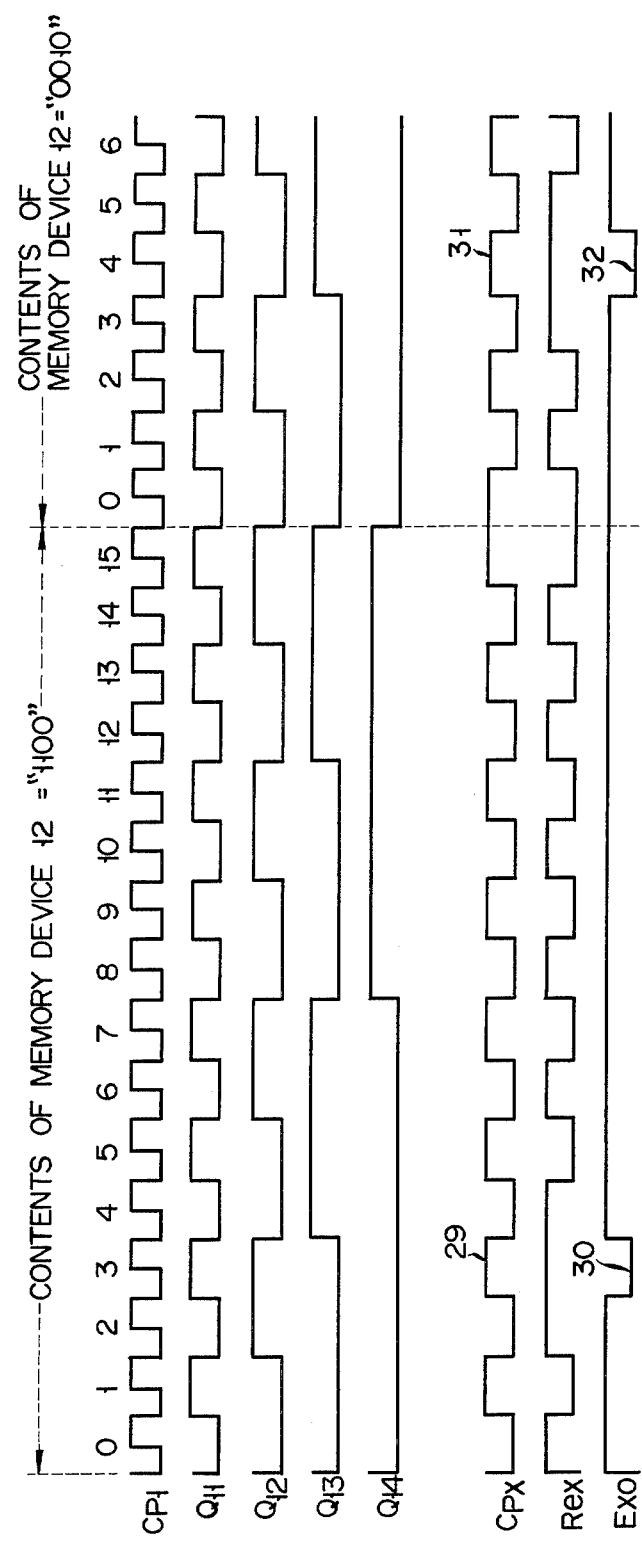
FIG. 4 shows a set of waveforms useful in explaining the operation of the FIG. 2 device.

A further detailed description of the FIG. 2 device will be given referring to FIG. 4. An example to be taken is the case where $[1100]_2 = [3]_{10}$ is stored in the memory device 12. In this case, the content in the unit 12a is "1" and therefore the output $C_{Px}$ is "1" every time the output $Q_{11}$ of the unit 11a is "1". In other words, the signal $Q_{11}$ and the signal $C_{Px}$ are in phase. Unless all the AND-OR circuits are opened, i.e. the respective corresponding units' contents (11b, 12b), (11c, 12c) and (11d, 12d) are coincident, the common line 19 is grounded and thus the signal R$ex$ takes an inverted phase with respect to the signal $C_{Px}$, i.e. "0" level. When three clock pulses of $CP_1$ are inputted, $Q_{11} = $ "1", $Q_{12} = $ "1", $Q_{13} = $ "0" and $Q_{14} = $ "0", i.e. the contents of the counter 11 is $[1100]_2 = [3]_{10}$. At this time, the contents between each corresponding units (11a, 12a), (11b, 12b), (11c, 12c) and (11d, 12d) are completely coincident. At this complete coincident period 29, the common line 19 is not earthed although the transistor $T_{13}$ is conductive so that the output signal R$ex$ is "1". During the period 29, $C_{Px} = $ "1" and R$ex = $ "1", and therefore the output E$xo$ of the NAND circuit 22 becomes "0" during the period 30.

Another example to be taken is the case where the content set in the memory device 12 is $[0010]_2 = [4]_{10}$. In this case, the contents of the memory unit 12a is "0" so that the output $C_{Px}$ becomes "1" every time the contents of the memory unit 11a becomes "0". Therefore, the signal $C_{Px}$ and the signal $Q_{11}$ are out of phase. At the time when the counter 11 counts four clock pulses $CP_1$, $Q_{11}$ = "0", $Q_{12}$ = "0", $Q_{13}$ = "1" and $Q_{14}$ = "0". Therefore, the contents of the counter 11 completely coincides with that of the memory device 12, i.e. $[0010]_2 = [4]_{10}$. During this coincident period 31, the common line 19 is not earthed through the transistor $T_{13}$ and thus the output signal R$ex$ becomes "1". During this period 31, the output $C_{Px}$ is "1" and thus the E$xo$ output of the NAND circuit 22 becomes "0".

In the above-mentioned embodiment, the binary output signal of the memory unit 11a is represented by $Q_{11}$, the negated binary output signal thereof by $\overline{Q}_{11}$, the binary output signal of the unit 12a by $Q_{21}$ and the negated binary output signal by $\overline{Q}_{21}$. With such an assumption, it will be easily seen that the input of the EXOR circuit 20 may be $Q_{21}$ and $\overline{Q}_{11}$. It is evident further that, if the output of the EXOR circuit 20 is inverted by an inverter (not shown) with a designation $C_{Px}$ given thereto, ($Q_{11}$, $Q_{21}$) and ($\overline{Q}_{11}$, $\overline{Q}_{21}$) may be used for the input of the EXOR circuit 20. More precisely, in this case, the negated output of the exclusive OR circuit is used for the signal $C_{Px}$; however, in this specification, the circuit to negate the output of the exclusive OR circuit is included in the illustrated exclusive OR circuit. The transistor $T_{13}$ may be replaced by the p-channel type one and the transistor $T_{14}$ by the n-channel type one. In this case, the transistors $T_1$ to $T_{12}$ must be of p-channel type and the power source $V_{DD}$ negative. For the frequency of the clock pulses $CP_1$ of more than 10 KHz, the capacitor 24 may be the stray capacitor. For less than 10 KHz, a suitable capacitor must additionally be connected between the line 19 and the ground. It will be noted that, since the AND-OR circuits 15, 16 and 17 constitute a wired OR circuit, the circuit construction is simplified and the signal transfer delay is minimized.

What is claimed is:

1. A counter output detector circuit comprising:
   a counter for counting input pulses and including first binary memory units which are connected in series and produce binary output signals ("1" or "0") and their negated binary output signals "$\overline{1}$" or "$\overline{0}$"), respectively;
   a memory device for storing reference data therein to be compared with the output data from said counter and which includes second binary memory units of the same number as of said first ones, producing binary output signal ("1" or "0") and their negated binary output signals ("$\overline{1}$" or "$\overline{0}$"), respectively;
   a plurality of switching circuits which receive as control input signals said binary output signals and their negated output signals from the pairs of corresponding said first and second memory units of said counter and said memory device except the pair of corresponding said first and second memory units at the first stage thereof, and open the paths between first and second terminals when the contents coincide between said first and second memory units;
   an exclusive OR circuit receiving at the input at least one output signal of said first stage binary memory unit of said counter and at least one output signal of said first stage binary memory unit of said memory device and producing a coincident signal when the contents coincide between said first stage memory units;
   a first switching transistor which is connected between a common connection line of said first terminals and a power source and is made nonconductive when receiving said coincident signal from said exclusive OR circuit;
   a second switching transistor which is connected between a common connection line of said second terminals and the ground, and is made conductive when receiving said coincident signal of said exclusive OR circuit; and
   a gate circuit receiving at the input a signal carried on said common connection line of said first terminal and the output signal of said exclusive OR circuit and providing a coincident output signal when the data outputs are coincident between said counter and said memory device.

2. A counter output detector circuit according to claim 1, in which said switching circuit connected between said first and second terminals is an AND-OR circuit including: a first AND circuit which is connected between said first and second terminals and includes a first metal oxide semiconductor transistor controlled by the binary output signal from said first binary memory unit and a second metal oxide semiconductor transistor controlled by the negated binary output signal of said second binary memory unit and a second AND circuit which is connected between said first and second terminals and includes a third metal oxide semiconductor transistor controlled by the negated binary output signal of said first memory unit and a fourth metal oxide semiconductor transistor controlled by the binary output signal of said second memory unit, said first to fourth metal oxide semiconductor transistors being of the same conductivity type.

3. A counter output detector circuit according to claim 1, in which said gate circuit for providing said coincident output signal between said counter and said memory device is a NAND gate circuit.

4. A counter output detector circuit according to claim 1, in which a capacitor is connected between said common connection line of said first terminal and the ground.

* * * * *